United States Patent [19]

Koopman et al.

[11] 4,081,825
[45] Mar. 28, 1978

[54] CONDUCTION-COOLED CIRCUIT PACKAGE

[75] Inventors: Nicholas George Koopman, Hopewell Junction; Paul Anthony Totta, Poughkeepsie, both of N.Y.

[73] Assignee: International Business Machines Corporation, Armonk, N.Y.

[21] Appl. No.: 779,123

[22] Filed: Mar. 18, 1977

Related U.S. Application Data

[62] Division of Ser. No. 720,471, Sep. 3, 1976.

[51] Int. Cl.² .................... H01L 23/48; H01L 29/40; H01L 23/02
[52] U.S. Cl. ........................................ 357/81; 357/65; 357/79; 357/80; 174/16 HS
[58] Field of Search .................... 357/80, 81, 82, 65, 357/79; 174/16 HS; 165/80

[56] References Cited

U.S. PATENT DOCUMENTS

| | | | |
|---|---|---|---|
| 2,776,920 | 1/1957 | Dunlap | 357/74 |
| 2,903,629 | 9/1959 | Walker | 357/81 |
| 3,197,839 | 8/1965 | Tiemann | 357/74 |
| 3,414,775 | 12/1968 | Melan et al. | 357/81 |
| 3,504,096 | 3/1970 | Nagel | 357/81 |
| 3,868,725 | 2/1975 | Degraaff | 357/81 |

OTHER PUBLICATIONS

Heat Dissipator Assemblies; IBM Technical Bulletin, vol. 8, No. 10, Mar. 1966, pp. 1460–1461.
Chip Cooling by Ing, IBM Technical Bulletin, vol. 13, No. 5, Oct. 1970, p. 1060.
External Module Heat Sink Fastened to Board, by Ing, IBM Technical Bulletin, vol. 14, No. 1, June 1971, p. 182.
Conduction Cooled Chip Module, by Hill, IBM Technical Bulletin, vol. 14, No. 9, Feb. 1972, p. 2689.

*Primary Examiner*—Andrew J. James
*Attorney, Agent, or Firm*—Thomas F. Galvin

[57] ABSTRACT

A circuit package exhibiting an excellent heat transfer path from a semiconductor chip or other heat-generating device to the heat-sink can or cover of the package. A heat-conducting pad is metallurgically bonded to either said cover or a surface of said device; the pad is also separably attached, but metallurgically unbonded, to the other. In one preferred embodiment, a readily deformable metal or alloy, such as indium, is metallurgically bonded to a limited central region of the heat sink cover. The deformable metal is separably attached to a major surface of the chip so that there is no stress between the chip or its joints and the solder during the electrical operation of the chip when it generates heat. The preferred method of fabrication involves the mechanical deformation of a mass of solder against the back side of the chip, after the solder has been metallurgically bonded to heat sink. The process may be accomplished either at high or low temperatures, depending upon the solder composition and the relative strength of the leads which join the chip to conductive lands on its supportive substrate.

16 Claims, 5 Drawing Figures

CONDUCTION-COOLED CIRCUIT PACKAGE

This is a division, of application Ser. No. 720,471 filed Sept. 3, 1976.

CROSS-REFERENCE TO A RELATED APPLICATION

This application is related to co-pending application Ser. No. 720,470, filed Sept. 3, 1976, now U.S. Pat. No. 4,034,468, in the name of Nicholas G. Koopman and assigned to the same assignee as the present application.

BACKGROUND OF THE INVENTION

1. Field of the Invention

This invention relates to the packaging of electric circuit devices such as micro-miniature integrated circuit chips. In particular, it relates to the dissipation of heat generated by the chip.

2. Description of the Prior Art

The dissipation of heat from a semiconductor chip is a major problem in the industry. As more and more transistors and other devices are fabricated within the semiconductor chip, the amount of heat which is generated during the electrical operation of the chip increases proportionally.

Semiconductor designers have long been aware of the need for removing the heat and have devised numerous ways to do so. Generally, the techniques can be segregated into two basic means: air cooling and liquid cooling. The latter technique usually involves placing the chip packages in a bath of low-boiling-point liquid such as fluorocarbon fluid, for example. This process is very efficient but raises problems with respect to the contamination of the devices by the liquid, leakage of the liquid from the container which could cause catastrophic failure, and increased manufacturing costs.

Air cooling, which generally involves contacting one or more surfaces of the semiconductor chip with a good heat conducting element such as copper, is cheaper, cleaner and unlikely to create problems of the aforementioned catastrophic failures. However, air cooling by simple, direct contact of the heat conductive element to the chip may not conduct sufficient heat away from the chip due to the imperfect, non-compliant nature of the contact; in addition, it imposes stresses within the chip and its interconnecting joints due to the direct transmission of forces caused by thermal expansion and contraction, mechanical disturbances, etc.

Air-cooled assemblies usually involve bonding the semiconductor chip to the heat conductive cap, which is also used for hermetically sealing the chip. Packages of this type are illustrated, for example, in the articles entitled "Chip Heat Sink Package Assembly" by Johnson et al. IBM Technical Disclosure Bulletin, March 1970, page 1665, and "Conduction Cooled Heat Plate for Modular Circuit Package", Dombrowskas et al., IBM Technical Disclosure Bulletin, July 1970, page 442. Although effective in removing heat from the chip, such structures involve metallurgical bonds both between the heat sink and semiconductor chip as well as the heat sink and the conductive sealing cap. Such structures may subject the chip and the chip joints to undue stresses during thermal expansion or contraction when the chip is in electrical operation.

In addition, rework capability is particularly important for packages in which a plurality of chips are mounted on a single substrate and enclosed by a single cover. It is often necessary to replace one defective chip out of many or to repair the wiring on the substrate. Bonded connections, however, cannot be disassembled to allow rework or repair.

Other packaging designs have recognized the need to provide both high thermal conductivty as well as the ability to absorb mechanical stress. See, for example, the article entitled "Conduction Cooled Chip Module", Dombrowskas et al., IBM Technical Disclosure Bulletin, February 1972, page 2689. The article suggests the use of pads of conductive dispersion material which never cure or completely harden between the chips and the heat sink. Such material, however, results in too high a thermal resistance to be practical.

SUMMARY OF THE INVENTION

It is therefore a primary object of our invention to improve the cooling of semiconductor chips and other electronic circuit elements such as high power transistors, resistors, etc.

It is a further object of our invention to provide a good heat conductive path from the chip without imposing undue stresses on the chip leads in its operating environment.

It is yet another object to allow for reworking of semiconductor packages containing pluralities of chips while also providing said good heat conductive paths.

It is another object of our invention to provide a method for manufacturing such circuit packages which is easily practiced in modern semiconductor manufacturing lines.

It is a more specific object of our invention to improve the cooling of semiconductor flip-chips which are connected to their support substrates by solder contacts.

These and other objects and advantages of our invention are achieved by providing a heat conducting pad between the semiconductor chip or other heat generating devices and the heat sink. The heat conducting pad is separably attached but metallurgically unbonded, at one of the interfaces and metallurgically bonded at the other interface.

In one preferred embodiment a readily deformable solder such as indium is metallurgically bonded to the inside of the heat sink enclosure. The metal is conformally attached to the semiconductor chip by mechanical deformation, so the metal is separably attached, i.e., metallurgically unbonded, at the chip-solder pad interface. The pad provides low thermal resistance and allows both thermal expansion and contraction without undue stress on the chip or its joints as well as easy disconnection of the chip or chips from the enclosure for reworking.

Our invention is useful for "flip-chip" packages in which the electrical connections from the active devices within the chip to the conductive lands on the supporting substrate comprise solder contacts from the front-side surface of the chip, as described in U.S. Pat. No. 3,429,040, issued in the name of L. F. Miller and assigned to the same assignee as the present application.

DESCRIPTION OF THE PREFERRED EMBODIMENTS

Figure 1A:
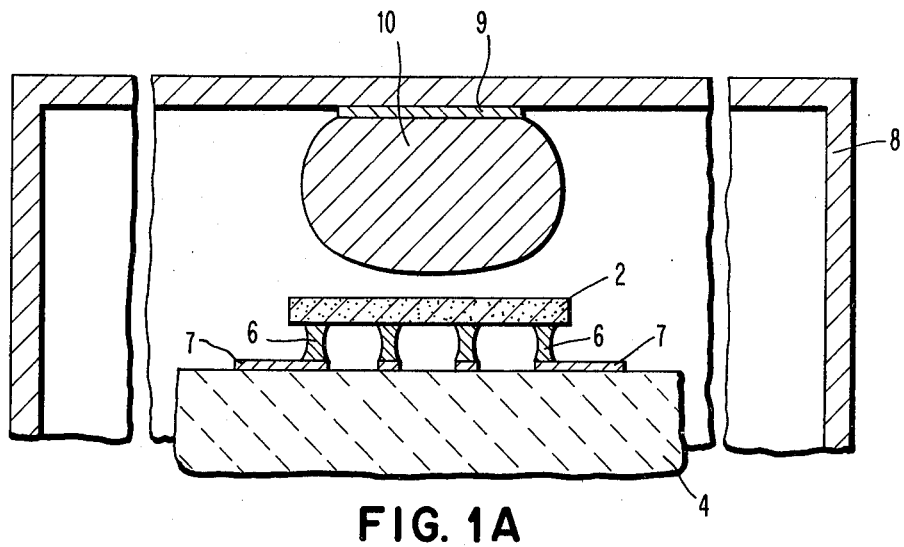
FIGS. 1A and 1B are cross-sectional views of an integrated circuit package wherein a heat-conducting pad which is metallurgically bonded to a heat sink enclosure is then separably attached to a chip by mechanical deformation.
Figure 1B:
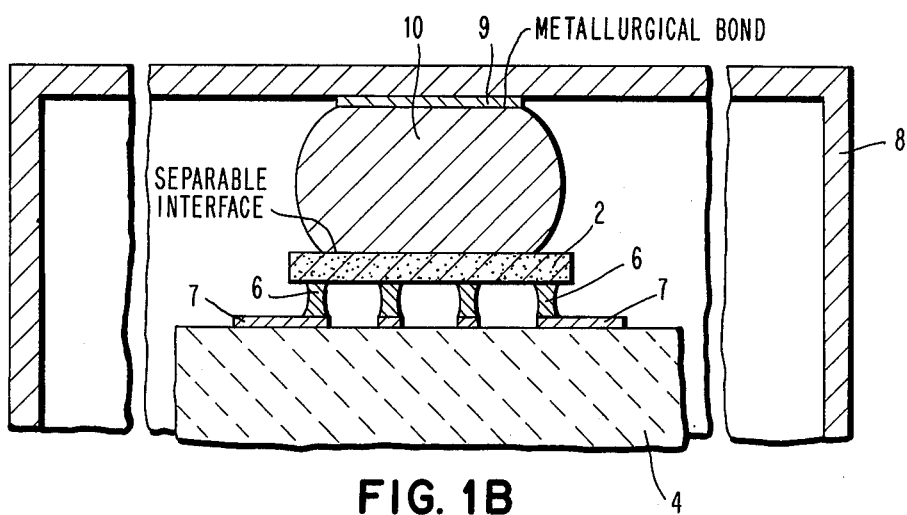

Referring now to FIGS. 1A and 1B, the circuit package comprises semiconductor chip 2 mounted on substrate 4, which is typically a ceramic such alumina. Conductive lands 7 are disposed on ceramic 4 and are connected to chip 2 by solder contacts 6. A heat-conductive cap 8 hermetically encloses chip 2 in cooperation with substrate 4. Conductive pins (not shown) are provided through substrate 4 to electrically interconnect lands 7 with an external printed circuit board (not shown). Although our invention is advantageously concerned with semiconductor chips containing many thousands of circuit elements, other heat-generating electric or electronic devices such as high power transistors, resistors, etc., could be heat-sinked in accordance with our invention.

What has been described thus far is well known to those of skill in the semiconductor packaging art and forms no part of our invention. Such a structure follows the teachings contained in U.S. Pat. No. 3,429,040 which was previously cited. Our invention involves the provision of heat conducting pad 10 between chip 2 and the interior of cap 8. Most importantly, a metallurgical bond is formed at one interface between pad 10 and either cap 8 or chip 2; and a non-metallurgical bond, termed a separable interface in the drawing, is formed at the other.

Prior to placing pad 10 in proximate relationship with chip 2 as shown in FIG. 1A, pad 10 is initially metallurgically bonded to cap 8 by means of a thin film 9. For example, if cap 8 were aluminum, film 9 could be copper which is evaporated thereon to form a metallurgical bond with the aluminum. Pad 10, which is preferably indium, is then reflowed to copper film 9. Because indium will solder with copper, a metallurgical bond is formed at the interface between indium pad 10 and heat sink cap 8. Other films 9 which could be used are nickel, gold and Cr-Cu-Au, among others.

Other techniques could be used to metallurgically bond the pad to the cap. For example, cap 8 could be copper or brass, to which indium 10 makes a metallurgical bond without the necessity of a solderable interface metal 9. However, to constrain solder 10 to a well-defined location on cap 8 over chip 2 it is necessary to provide a stop-off to which pad 10 will not solder, e.g., chromium, which surrounds the central site to prevent the solder from flowing over the entire inner surface of cap 8.

In practice, the chromium is evaporated on the interior of cap 8. An opening is then milled or etched in the chromium at said central site under which the chip is to be disposed; and the indium is reflowed to the brass or copper area surrounded by the chromium stop off.

Bonded pad 10 is then placed adjacent the upper major surface of chip 2 as shown in FIG. 1A. Pressure is then applied to compress the readily deformable metal 10 between chip 2 and cap 8 to achieve the structure illustrated in FIG. 1B. We have done this by applying a weight onto either the back side of substrate 4 while the structure is upside down or by applying the weight onto the upper surface of cap 8 while the structure is right side up.

There are numerous methods which could be used to compress the heat conducting pad 10; however, it is important that the weight be carefully selected and controlled so as not to exceed the yield stress of joints 6. This is easily achieved when using a readily deformable metal such as indium as pad 10 and lead/tin or lead/indium solder for joints 6. For example, for a chip which is 180 mils square with 240 or more solder joints 6, the area encompassed by pad 10 is around six times greater than the area encompassed by joints 6. However, the yield-stress in psi for the solder joints at room temperature is 13 times greater than that of pad 10. Hence, the latter yields first.

The margin of safety can be increased, if desired, by performing the compression step at a higher temperature. This tends to reduce the yield-stress of indium to an even greater extent than that of lead-tin or lead-indium solder. At 60° C, for example, the yield stress ratio of lead-tin solder to indium solder is greater than 20, which is much greater than the figure of six which must be exceeded. If a hard encapsulant such as polyimide-amide were used as a sealer between the joints, this effectively strengthens the joints.

Other alternatives which are less attractive include the addition of "dummy" joints to increase the effective mass of solder joints 6 beneath the chip or by reducing the mass of pad 10. This latter alternative has the disadvantage of decreasing the heat dissipation capability of the package. In devices which we have constructed using the method illustrated in FIGs. 1A and 1B, we have achieved a thermal resistance of 2.5° C per watt from the chip to air. Without the indium pad 10, the resistance is 14° C per watt.

It may be necessary to provide electrical isolation between the circuit within chip 2 and cap 8. There are numerous options to ensure this which will occur to those of skill in the semiconductor packaging art. For example, a thin film insulator could be provided between the inner surface of cap 8 and thin film 59. Alternatively, a thin film insulator such as silicon dioxide, silicon nitride, etc., could be provided on the upper surface of chip 2 prior to compressing pad 10 to chip 2. In the case of the silicon semiconductor chip, silicon dioxide usually occurs as part of the chip as a natural consequence of device fabrication.

Cap 8 could itself be an electrically insulating thermally conductive material such as beryllium oxide.

Even though our invention is preferably applied to solder-bonded joints, it is also applicable to other conventional joining methods such as where electrical leads are thermal-compression bonded or ultrasonically bonded between the chip and the conductive lands 7.

To further decrease the thermal resistance between chip 2 and pad 10 the interface may be coated with a heat conducting medium such as silicone oil.

Figure 2:
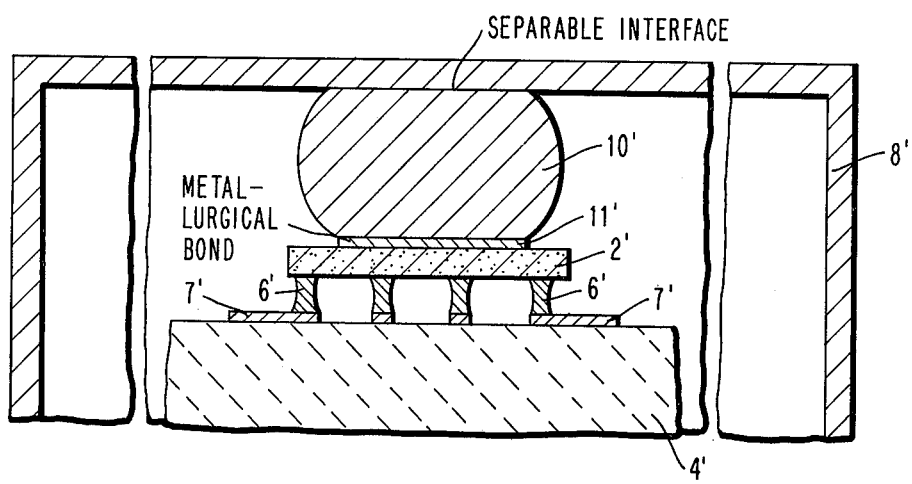
FIG. 2 is a cross-sectional view of a package wherein said pad is metallurgically bonded to the chip and separably attached to the heat sink.

Turning now to FIG. 2, there is shown a module in which the unbonded, separable interface lies between solder pad 10' and metal cap 8'; and the metallurgical bond is between pad 10' and chip 2' by means of thin film 11'. Typically, film 11' is Cr-Cu-Au to which indium will solder and which adheres well to silicon or insulators of silicon such as silicon dioxide and silicon nitride. Other suitable thin films to which indium will solder and which will bond with silicon are Cr-Cu, Cr-Ni and Ti-Pd-Au.

The process for fabricating the package in FIG. 2 is similar to that described in FIGS. 1A and 1B. Most advantageously, thin film 11' is metallurgically bonded by evaporation or other deposition techniques on the upper major surface of chip 2'. Indium solder pad 10' is deposited atop film 11' and then reflowed above its melting point to form the metallurgical bond. After the pad has hardened, the substrate-chip-solder portion is compressed against the inner central region of cap 8' to form the unbonded, separable interface.

Figure 3:
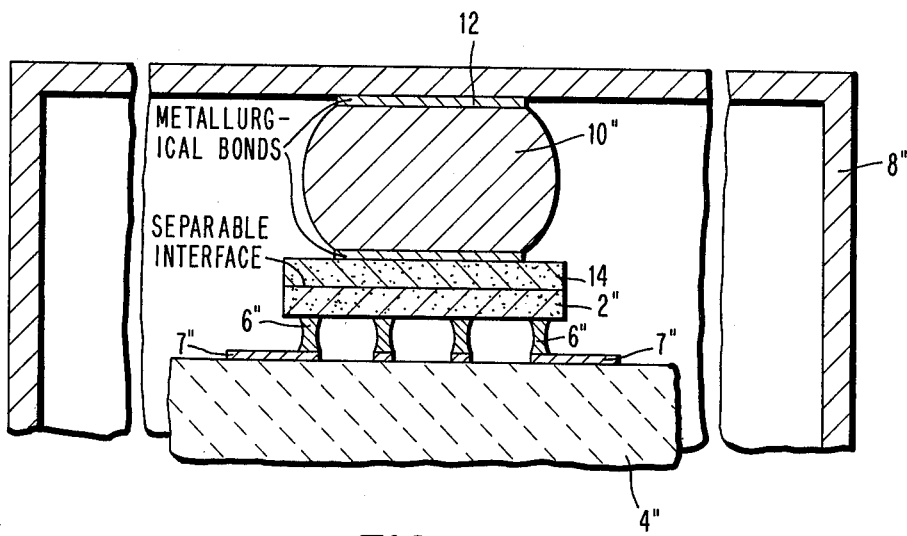
FIG. 3 is a cross-sectional view of a package similar to that of FIG. 1B which includes a "dummy" chip between the pad and an operative, heat generating chip.

In the embodiment illustrated in FIG. 3, a "dummy" chip 14 is disposed between pad 10" and the active heat-generating chip 2". The principal purpose of the "dummy" chip is to achieve a complete area match between chip 2" and the heat conducting pad 10". It could also be used to provide good electrical isolation to prevent chip-to-heat sink shorting. In multi-chip modules such a chip prevents chip-to-chip shorting without thermal degradation of the heat conducting path.

The "dummy" chip is advantageously comprised of silicon having both sides coated with an insulator such as silicon dioxide or silicon nitride. The "dummy" chip may also comprise anodized aluminum or beryllium oxide. This latter material has the advantages of being both a good electrical insulator as well as having high thermal conductivity. However, it is also quite poisonous in its powdered state prior to molding and, on the whole, an insulated silicon chip is more useful in the present day semiconductor manufacturing environment.

The "dummy" chip 14 may also comprise a thin film of a material such as copper. This would prevent any surface corrosion of pad 10" which might occur with pure indium. In addition, the film would eliminate any tendency of indium to stick to chip 2".

As illustrated in FIG. 3, solder pad 10" is metallurgically bonded both to cap 8" and to "dummy" chip 14. The interface between chips 2" and 14 is unbonded. The chips are made as contiguous as possible by the compressing step to ensure an optimum heat conducting path from heat-generating chip 2" to cap 8".

The use of an extended "dummy" chip 14 in FIG. 3 also leads to the alternative of substituting an array of numerous, individual solder pads for the single solder pad 10'. These may be desirable to avoid problems associated with deforming a large mass of solder 10". They would create no problem with respect to heat dissipation because the thermal resistance across solder 10" is usually low as compared to that across the unbonded interface.

Multiple solder pads are most attractive for chips which are very large, e.g., one-half inch square.

Figure 4:
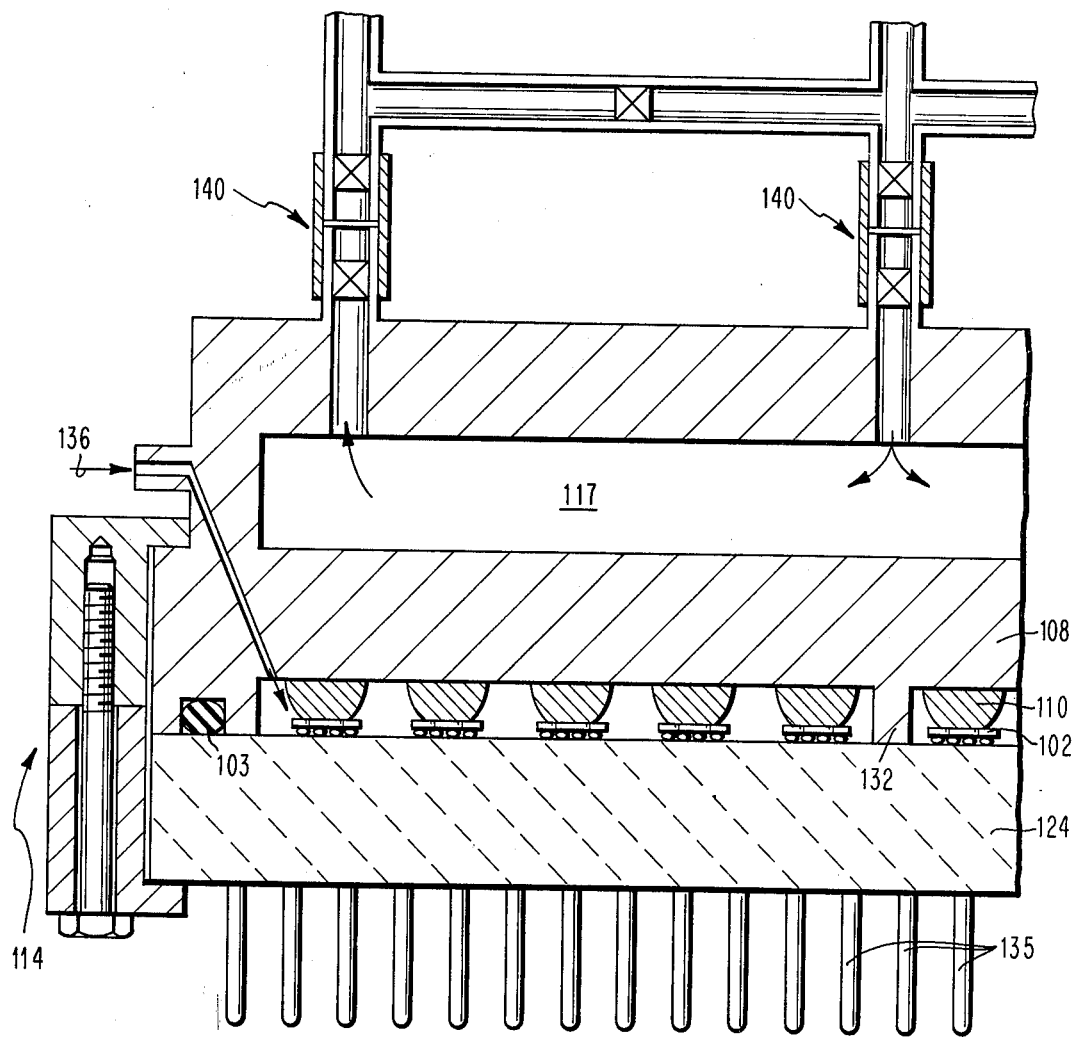
FIG. 4 is a cross-sectional view of a multi-chip module in which each chip has a separate heat sink pad in accordance with our invention.

FIG. 4 illustrates a multi-chip module which embodies our invention. Such modules, containing up to one hundred or more semiconductor integrated circuit chips have been proposed in the past but none has been commercially successful to our knowledge. Ordinarily, they are cooled by a boiling liquid within the chamber containing the chips and this has resulted in the problems previously discussed in the section of the specification entitled, "Background of the Invention".

In the package, each chip 102 is thermally connected to heat sink cover 108 by solder pads 110. Any of the previously-described embodiments involving a metallurgically bonded interface and an unbonded, separable interface is applicable. Advantageously, cap 108 may be fabricated from Mo or BeO which have low thermal expansion coefficients to match alumina substrate 124 formed with connector pins 135. However, due to fabrication difficulties of Mo and the health hazards of BeO, Al or Cu are more practical choices. Standoffs 132 are provided as positive stops to avoid inordinate pressure on any chip from the cap.

After each pad 110 is compressed between cap 108 and chip 102, the cap is sealed to substrate 104 by means of an O-ring 103 and the locking mechanism 114 which comprises a pair of engaging plates which are bolted together. A gas port 136 is provided through cap 108 to allow for the entry of a gas such as helium which, having a higher thermal coefficient than air, increases the heat dissipation of the system. The use of helium for this purpose is optional and in any event forms no part of our invention.

Cap 108 is machined to provide a chamber 117 for external fluid cooling. The fluid could be water, Freon or any other known cooling fluid which flows through the upper surface of the cap by means of plumbing connection 140 to an external cooling system (not shown).

Other types of packages may be devised to incorporate our invention. The system in FIG. 4 is illustrated only to indicate how such a system may effectively utilize our invention. One of the principal advantages of such a package with a separable interface in the heat conducting path is that a defective component may be replaced or repaired after assembly because the entire package can be separated at the unbonded separable interface. Upon repair, the package is easily reassembled.

Another advantage lies in the option of using chips which have different heat-generating properties in the same package. The pads can be tailored to ensure that each chip operates at the same temperature. Moreover, the cap 108 could contain pedestals or recesses for the heat-sink pads to accommodate different types of components.

In summary, we have invented a package having a good heat transfer path from a semiconductor device or other heat-generating element to the can or cover of the package. Moreover, the improvement avoids the imposition of mechanical stresses which endanger the integrity of the device or its leads during the electrical operation of the device in its environment.

While the invention has been particularly shown and described with reference to preferred embodiments thereof, it will be understood by those skilled in the art that various changes in form and details may be made therein without departing from the spirit and scope of the invention.

We claim:

1. In a circuit package in which a heat-generating component is cooled by conduction of heat to a heat-sink component, the improvement comprising:
   a pad of metal which is metallurgically bonded to a major surface of either one or the other of said components and separably attached to a major surface of the other of said components.

2. A package as in claim 1 wherein said metal is selected from the group consisting of indium and indium alloy.

3. A package as in claim 1 wherein said heat-generating element is a semiconductor chip.

4. A package as in claim 3 wherein said chip is electrically connected to a substrate by means of solder joints which are disposed on the surface of said chip which is opposite said major surface of said chip.

5. In a circuit package in which a semiconductor chip is cooled by a heat-sink cover, the improvement comprising:
   a pad of metal which is metallurgically bonded to a central region of said cover and separably attached to a major surface of said chip.

6. A package as in claim 1 further comprising a heat conductive fluid disposed between said pad and said component.

7. A package as in claim 5 wherein said cover is a material with which said pad does not form a metallurgical bond and further comprising:
   another metal film disposed between said cover and said pad to which said pad and said cover form metallurgical bonds.

8. In a circuit package in which a semiconductor chip is cooled by a heat-sink cover, the improvement comprising:
   a pad of metal which is metallurgically bonded to a major surface of said chip and separably attached to a central region of said cover.

9. A package as in claim 8 wherein said surface of said chip is a material with which said pad does not form a metallurgical bond and further comprising:
   another metal film disposed between said chip and said pad to which said chip and said pad form metallurgical bonds.

10. In a circuit package in which a semiconductor chip is cooled by a heat-sink cover, the improvement comprising:
    a pad of metal which is metallurgically bonded at opposite sides to a central region of said heat-sink cover and to a component which has a major surface conforming to a major surface of said chip;
    said major surfaces to said component and said chip being separably attached to each other.

11. A package as in claim 10 wherein said component is a chip having substantially at least the same major surface area as said semconductor chip.

12. A package as in claim 10 wherein said component is selected from the group consisting of silicon, anodized aluminum and beryllium oxide.

13. In a circuit package in which a semiconductor chip is cooled by a heat-sink cover, the improvement comprising:
    a plurality of spaced apart, metal pads which are metallurgically bonded at opposite sides to said heat-sink cover and to a component which has a major surface conforming to a major surface of said chip;
    said major surfaces of said component and said chip being separably attached to each other.

14. A package as in claim 13 wherein said component is a chip having substantially at least the same major surface area as said semiconductor chip.

15. A package as in claim 13 wherein said component is selected from the group consisting of silicon, anodized aluminum and beryllium oxide.

16. In a circuit package in which a plurality of heat-generating components are cooled by conduction of heat to a heat-sink component, the improvement comprising:
    a plurality of spaced-apart, metal pads;
    each said pad being metallurgically bonded to either a respective major surface of said heat generating components or said heat-sink; and
    each said pad being separably attached to the other of said heat-generating components or said heat-sink.

* * * * *

UNITED STATES PATENT AND TRADEMARK OFFICE
CERTIFICATE OF CORRECTION

PATENT NO. : 4,081,825
DATED : March 28, 1978
INVENTOR(S) : N. G. Koopman et al

It is certified that error appears in the above-identified patent and that said Letters Patent are hereby corrected as shown below:

Column 2, line 5: Delete "conductivty" and substitute therefor --conductivity--;

Column 5, line 48: Delete "10'" and substitute therefor --10"--.

Signed and Sealed this

Seventeenth Day of October 1978

[SEAL]

Attest:

RUTH C. MASON
Attesting Officer

DONALD W. BANNER
Commissioner of Patents and Trademarks